United States Patent [19]

Hasegawa

[11] Patent Number: 5,786,783
[45] Date of Patent: Jul. 28, 1998

[54] ANALOG-TO-DIGITAL CONVERTER HAVING SIGNAL PIPELINE AND REFERENCE PIPELINES

[75] Inventor: Hiroshi Hasegawa, Tokyo, Japan

[73] Assignee: NEC Corporation, Tokyo, Japan

[21] Appl. No.: 669,182

[22] Filed: Jun. 24, 1996

[30] Foreign Application Priority Data

Jun. 23, 1995 [JP] Japan ................... 7-180728

[51] Int. Cl.[6] .................................................. H03M 1/42
[52] U.S. Cl. .................................................. 341/172
[58] Field of Search ............................ 341/172, 155, 341/161, 162

[56] References Cited

U.S. PATENT DOCUMENTS 4,326,192  4/1982  Merrill et al. .

5,189,423  2/1993  Linnenbrink et al. ............. 341/172

*Primary Examiner*—Brian K. Young
*Attorney, Agent, or Firm*—Helfgott & Karas, P.C.

[57] ABSTRACT

A pipelined analog-to-digital (A/D) converter includes a signal charge-coupled device (CCD) pipeline formed by stages for passing analog signals therethrough, and a plurality of reference CCD pipelines each for passing reference signals therethrough. A plurality of comparators are provided for comparing output analog signals from the stages of the signal CCD pipelines with respective output signals of the reference CCD pipelines. An encoded digital signal is obtained in accordance with the output signals of the comparators.

8 Claims, 15 Drawing Sheets

Fig. 2 PRIOR ART

| Vin(V) | D2 | D1 | D0 |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

Fig. 10

| CMP 1 | CMP 2 | CMP 3 | CMP 4 | CMP 5 | CMP 6 | CMP 7 | H1 | H2 | H3 | H4 | H5 | H6 | H7 | D2 | D1 | D0 |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 1 | 0 | 0 | 0 | 0 | 0 | 0 | 0 | 0 | 1 |
| 1 | 1 | 0 | 0 | 0 | 0 | 0 | 0 | 1 | 0 | 0 | 0 | 0 | 0 | 0 | 1 | 0 |
| 1 | 1 | 1 | 0 | 0 | 0 | 0 | 0 | 0 | 1 | 0 | 0 | 0 | 0 | 0 | 1 | 1 |
| 1 | 1 | 1 | 1 | 0 | 0 | 0 | 0 | 0 | 0 | 1 | 0 | 0 | 0 | 1 | 0 | 0 |
| 1 | 1 | 1 | 1 | 1 | 0 | 0 | 0 | 0 | 0 | 0 | 1 | 0 | 0 | 1 | 0 | 1 |
| 1 | 1 | 1 | 1 | 1 | 1 | 0 | 0 | 0 | 0 | 0 | 0 | 1 | 0 | 1 | 1 | 0 |
| 1 | 1 | 1 | 1 | 1 | 1 | 1 | 0 | 0 | 0 | 0 | 0 | 0 | 1 | 1 | 1 | 1 |

ANALOG-TO-DIGITAL CONVERTER HAVING SIGNAL PIPELINE AND REFERENCE PIPELINES

BACKGROUND OF THE INVENTION

1. Field of the Invention

The present invention relates to an analog-to-digital (A/D) converter, and more particularly, to an A/D converter having charge-coupled device (CCD) pipelines.

2. Description of the Related Art

As A/D converters, sequential successive approximation A/D converters have been broadly used.

A first prior art sequential successive approximation A/D converter includes a sample/hold circuit for storing a signal voltage, a D/A converter for generating a reference voltage, a comparator for comparing the signal voltage with the reference voltage, and a control circuit for controlling the D/A converter in accordance with the output signal of the comparator to generate an encoded digital signal. This will be explained later in detail.

In the above-described first prior art A/D converter, however, since the sample/hold circuit continues to hold one signal voltage until its encoded digital signal is determined, the A/D conversion speed (throughput) is substantially reduced. In this case, the throughput is mainly dependent upon N times of a setting time of the D/A converter, where N is the number of bits of the encoded digital signal.

In a second prior art sequential successive approximation A/D converter, a signal CCD pipeline for passing successive analog signals therethrough is provided instead of the sample/hold circuit of the first prior art A/D converter, and also, a plurality of D/A converters and a plurality of comparators are provided, thus substantially enhancing the throughput (see: U.S. Pat. No. 4,326,192). This will be also explained later in detail.

In the above-described second prior art A/D converter, however, even when the comparators can be operated at a high speed, the settling time of each of the D/A converters is required, so that there is a limit in the operation speed of the A/D conversion. In other words, a large throughput cannot be expected.

Also, in the second prior art A/D converter, the transfer efficiency of each stage of the signal CCD pipeline is not always 100%, so that a charge transferred through the stages of the signal CCD pipeline is changed. Therefore, particularly when the signal CCD pipeline is long, an error of the A/D conversion becomes large, and in addition, it is impossible to correct such an error.

Further, the transfer efficiency of each stage of the signal CCD pipeline may be brought close to 100%, to reduce the above-mentioned error of the A/D conversion; however, in this case, the manufacturing cost of the A/D converter is increased.

SUMMARY OF THE INVENTION

It is an object of the present invention to enhance the throughput of a pipelined A/D converter.

Another object is to reduce the error of a pipelined A/D converter.

According to the present invention, a pipelined A/D converter includes a signal CCD pipeline formed by stages for passing analog signals therethrough, and a plurality of reference CCD pipelines each for passing reference signals therethrough. A plurality of comparators are provided for comparing output analog signals from the stages of the signal CCD pipeline with respective output signals of the reference CCD pipelines. An encoded digital signal is obtained in accordance with the output signals of the comparators.

Thus, the reference CCD pipelines serve as the D/A converters of the prior art A/D converter which require a settling time. Therefore, no settling time is necessary to enhance the throughput.

Also, the operation characteristics of the reference CCD pipelines are similar to those of the signal CCD pipeline, for example, the transfer efficiecy of the reference CCD pipelines is similar to that of the signal CCD pipeline. Therefore, the characteristics of the analog signal through the signal CCD pipeline are similar to those of the reference signals through the reference CCD pipelines. As a result, even when the transfer efficiency of the signal CCD pipeline and the reference CCD pipelines is low, errors in the A/D conversion can be reduced.

BRIEF DESCRIPTION OF THE DRAWINGS

The present invention will be more clearly understood from the description as set forth below, as compared with the prior art, with reference to the accompanying drawings, wherein:

FIG. 2 is a table showing the digital signal of the A/D converter of FIG. 1;

FIG. 10 is a table showing a relationship among the output signals of the comparators, the boundary detecting circuits and the encoder circuit of FIG. 9;

DESCRIPTION OF THE PREFERRED EMBODIMENTS

Before the description of the preferred embodiments, prior art sequential successive approximation A/D converters will be explained with reference to FIGS. 1 and 2.

Figure 1:
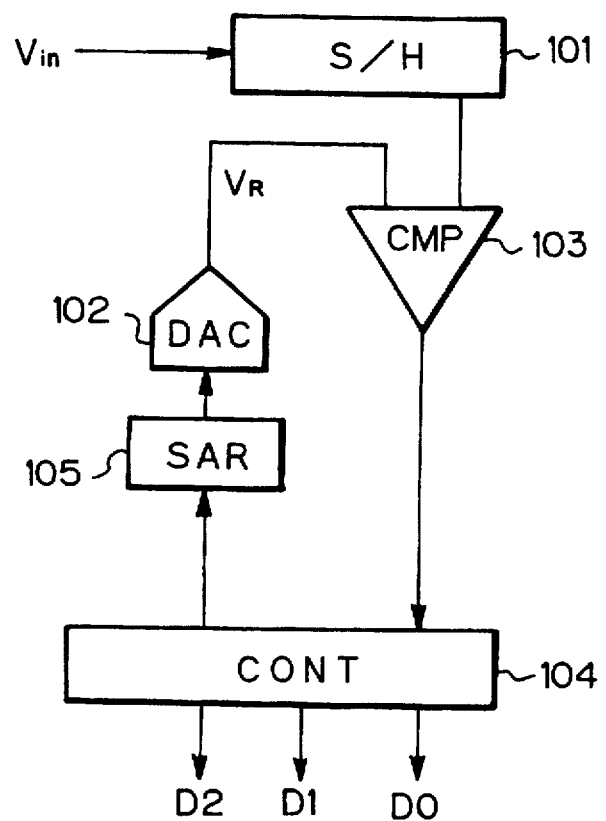
FIG. 1 is a block circuit diagram illustrating a first prior art sequential successive approximation A/D converter.

In FIG. 1, which illustrates a first prior art A/D converter, reference numeral 101 designates a sample/hold circuit for sampling a signal voltage $V_{in}$ and holding it, and 102 designates a D/A converter for generating a reference voltage $V_R$. A comparator 103 compares the signal voltage $V_{in}$ with the reference voltage $V_R$. A control circuit 104 receives the output signal of the comparator 103 to control the content of a sequential approximation register 105 to change the reference voltage $V_R$. Finally, the control circuit 104 generates an N-bit digital signal. Note that N times of comparison operations by the comparator 103 are performed upon the same signal voltage $V_{in}$ to obtain the N-bit digital signal. For example, if N is 3, the 3-bit digital signal denoted by D0, D1 and D2 is as shown in FIG. 2.

The operation of the A/D converter of FIG. 1 will explained next. In this case, assume that N is 3 and $V_{in}$ is 4.7 V.

First, the control circuit 104 sets "011" corresponding to 3.5 V in the register 105, so that the output voltage $V_R$ of the D/A converter 102 is 3.5 V. As a result, the comparator 103 compares the signal voltage $V_{in}$ (=4.7 V) with the reference voltage $V_R$(=3.5 V). Therefore, since $V_{in>VR}$, the comparator 103 generates "1" and transmits it to the control circuit 104. Thus, the most significant bit (MSB) D2 is caused to be "1".

Next, the control circuit 104 generates either "001" corresponding to 1.5 V or "101" corresponding to 5.5 V in accordance with the first comparison result D2. In this case, since the first comparison result D2 is "1", the control cirucit 104 generates "101". That is, the control circuit 104 sets "101" corresponding to 5.5 V in the register 105, so that the output voltage $V_R$ of the D/A converter 102 is 5.5 V. As a result, the comparator 103 compares the signal voltage $V_{in}$ (=4.7 V) with the reference voltage $V_R$(=5.5 V). Therefore, since $V_{in<VR}$, the comparator 103 generates "0" and transmits it to the control circuit 104. Thus, the second significant bit D1 is caused to be "0".

Finally, the control circuit 104 generates either "000" corresponding to 0.5 V, "010" corresponding to 2.5 V, "100" corresponding to 4.5 V, or "111" corresponding to 6.5 V in accordance with the first comparison result D2 and the second comparison result D1. In this case, since the first comparison result D2 is "1" and the second comparison result D1 is "0", the control circuit 104 generates "100". That is, the control circuit 104 sets "100" corresponding to 4.5 V in the register 105, so that the output voltage $V_R$ of the D/A converter 102 is 4.5 V. As a result, the comparator 103 compares the signal voltage $V_{in}$ (=4.7 V) with the reference voltage $V_R$(=4.5 V). Therefore, since $V_{in}>V_R$, the comparator 103 generates "1" and transmits it to the control circuit 104. Thus, the least significant bit (LSB) D0 is caused to be "1".

Thus, the 3-bit code (D2, D1, D0)=(1, 0, 1) is obtained.

In the art A/D converter of Fig. 1, however, since the sample/hold circuit 101 continues to hold one signal voltage $V_{in}$ until its encoded digital signal (D2, D1, D0) is determined, the A/D conversion speed (throughput) is substantially reduced, since the throughput is mainly dependent upon 3 times a settling time of the D/A converter 102.

Figure 3:
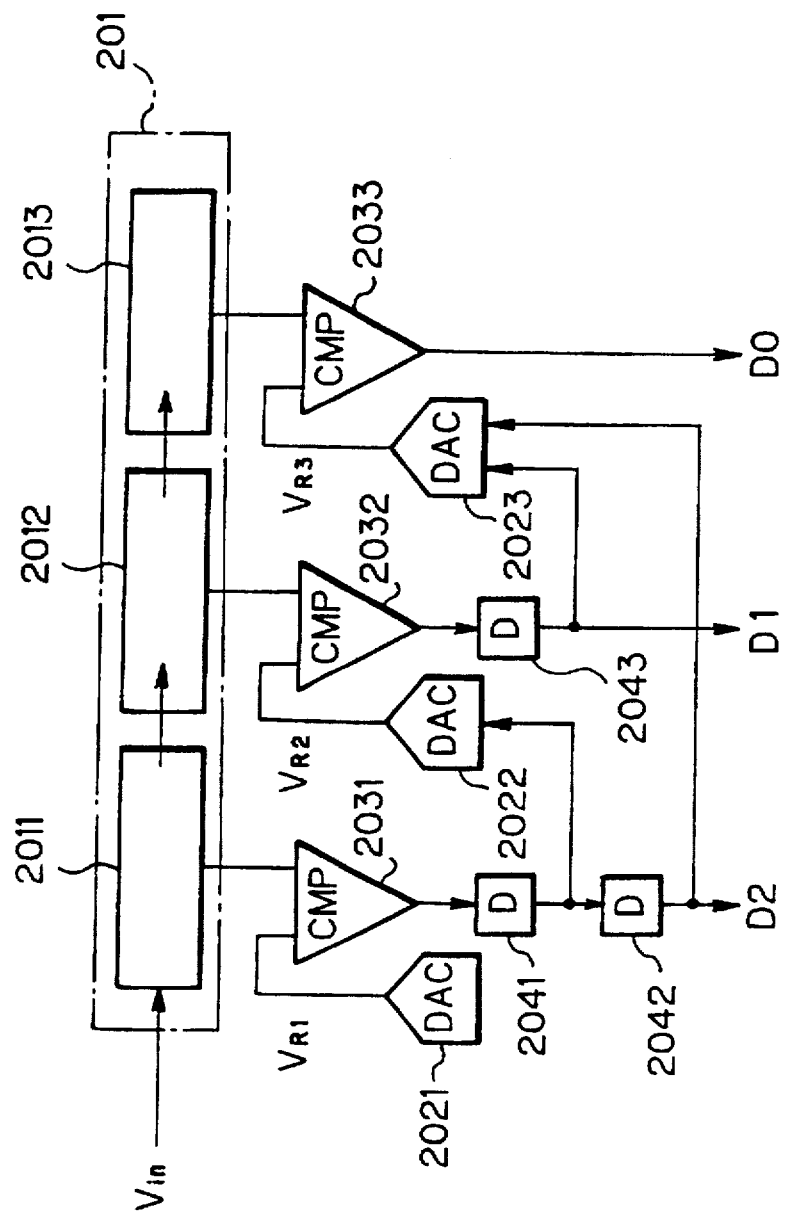
FIG. 3 is a block circuit diagram illustrating a second prior art sequential successive approximation A/D converter.

In FIG. 3, which illustrates a second prior art A/D converter (see: U.S. Pat. No. 4,326,192), a signal CCD pipeline 201 formed by three CCD stages 2011, 2012 and 2013 corresponds to the sample/hold circuit 101 of FIG. 1, three D/A converters 2021, 2022 and 2023 correspond to the D/A converter 102 of FIG. 1, and three comparators 2031, 2032 and 2033 correspond to the comparator 103 of FIG. 1. Also, delay circuits 2041, 2042 and 2043 correspond to the control circuit 104 and the register 105 of FIG. 1. That is, the output voltage $V_{R^1}$ of the D/A converter 2021 is constant, while the output voltages $V_{R^2}$ and $V_{R^3}$ of the D/A converters 2022 and 2023 are variable. In more detail, the output voltage $V_{R^2}$ of the D/A converter 2022 is determined by the first comparison result of the comparator 2031 via the delay circuit 2041, and the output voltage $V_{R^3}$ of the D/A converter 2023 is determined by the first comparison result of the comparator 2031 via the delay circuits 2041 and 2042 and the second comparison result of the comparator 2032 via the delay circuit 2043. Therefore, a settling time is unnecessary for the D/A converter 2021, while a settling time is necessary for each of the D/A converters 2022 and 2023.

In the A/D converter of FIG. 3, while an A/D conversion is performed upon one signal voltage, another A/D conversion is performed upon another signal voltage. That is, although three comparsion operations are required for each signal voltage in the same way as in the A/D converter of FIG. 1, A/D conversions are performed upon three signal voltages simultaneously. In other words, an A/D conversion upon one signal voltage is completed for one comparison time by the comparators 2031, 2032 and 2033. Thus, the throughput of the A/D converter of FIG. 3 is three times that of the A/D converter of FIG. 1.

In the A/D converter of FIG. 3, however, even when the comparators 2031, 2032 and 2033 can be operated at a high speed, the settling time of each of the D/A converters 2022 and 2023 is required, so that there is a limit in the operation speed of the A/D conversion. In other words, a large throughput cannot be expected.

Also, in the A/D converter of FIG. 3, the transfer efficiency of each of the CCD stages 2011, 2012 and 2013 of the signal CCD pipeline 201 is not always 100%, so that a charge transferred through the CCD stages 2011, 2012 and 2013 of the signal CCD pipeline 201 is changed. Therefore, particularly when the number of CCD stages of the signal CCD pipeline 201 is increased, an error of the A/D conversion becomes large, and in addition, it is impossible to correct such an error.

Further, the transfer efficiency of each stage of the signal CCD pipeline may be brought close to 100%, to reduce the above-mentioned error of the A/D conversion; however, in this case, the manufacturing cost of the A/D converter of FIG. 3 is increased.

Figure 4:
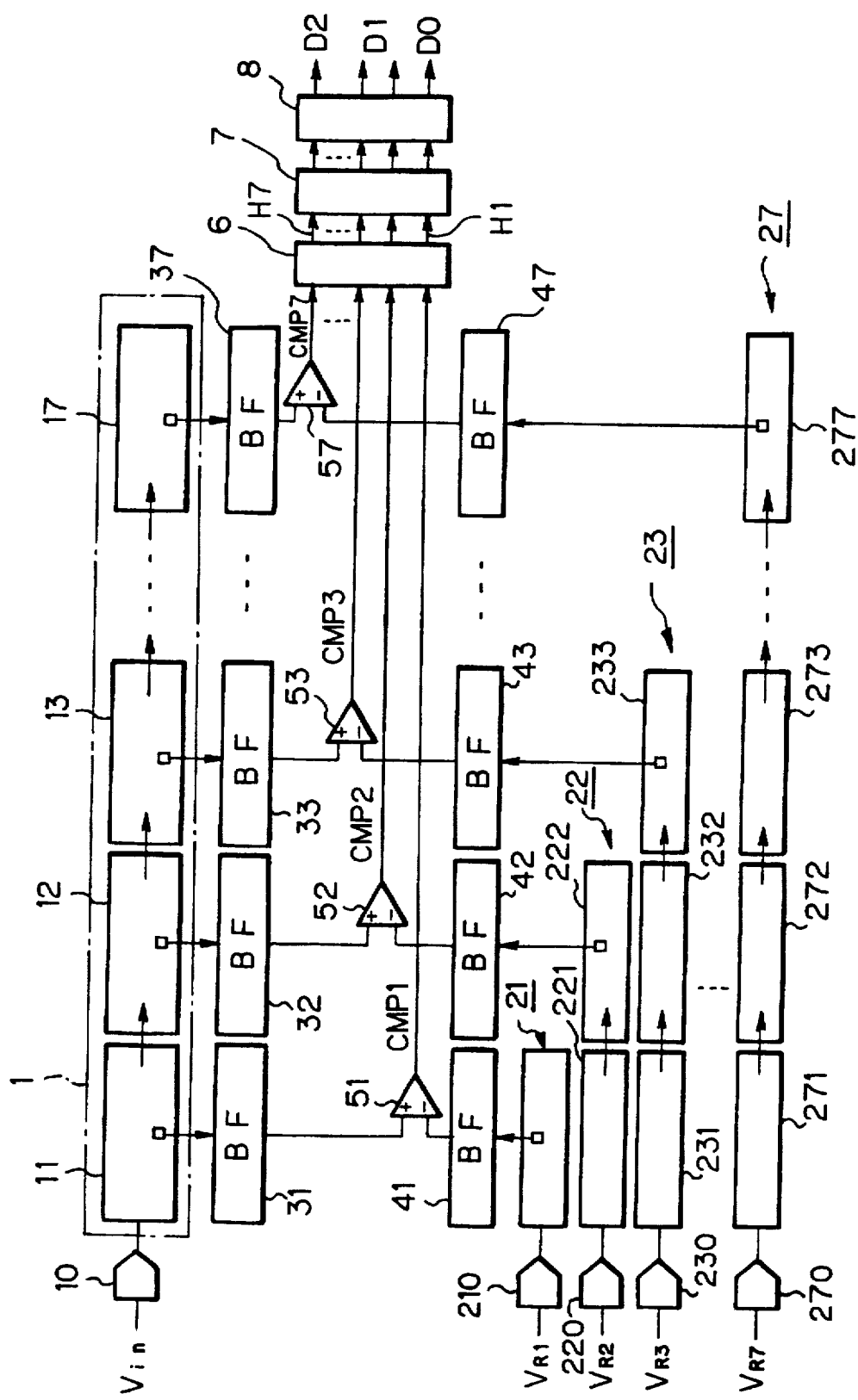
FIG. 4 is a circuit diagram illustrating a first embodiment of the A/D converter according to the present invention.

In FIG. 4, which illustrates a first embodiment of the present invention, reference numeral 1 designates a signal CCD pipeline formed by seven ($7=2^3-1$) CCD stages 11, 12, 13, . . . , 17. The signal CCD pipeline 1 receives a signal voltage $V_{in}$ from a charge input portion 10 and passes a charge corresponding to the signal voltage $V_{in}$ therethrough.

Also, seven reference CCD pipelines 21, 22, 23, . . . , 27 are provided. In this case, the reference CCD pipeline 21, which is formed by one CCD stage, receives a reference voltage $V_{R^1}$ from a charge input portion 210 and passes a charge corresponding to the signal voltage $V_{R^1}$ therethrough. Also, the reference CCD pipiline 22, which is formed by two CCD stages 221 and 222, receives a reference voltage $V_{R^2}$ from a charge input portion 220 and passes a charge corresponding to the signal voltage $V_{R^2}$ therethrough. Further, the reference CCD pipiline 23, which is formed by three CCD stages 231, 232 and 233, receives a reference voltage $V_{R^3}$ from a charge input portion 230 and passes a charge corresponding to the signal voltage $V_{R^3}$ therethrough. Similarly, the reference CCD pipeline 27, which is formed by seven CCD stages 271, 272, 273, . . . , 277, receives a reference voltage $V_{R^7}$ from a charge input portion 270 and passes a charge corresponding to the signal voltage $V_{R^7}$ therethrough. Note that the reference voltages $V_{R^1}$, $V_{R^2}$, $V_{R^3}$, . . . , $V_{R^7}$ satisfy the following condition: $V_{R^1}<V_{R^2}<V_{R^3}<\ldots<V_{R^7}$ The output signals of the CCD stages 11, 12, 13, . . . , 17 of the signal CCD pipeline 1 are supplied to buffers 31, 32, 33, . . . , 37, respectively. On the other hand, the output signal of the reference CCD pipeline 21, the output signal of the last CCD stage 222 of the reference CCD pipeline 22, the output signal of the last CCD stage 233 of the reference CCD pipeline 23, . . . , and the output signal of the last CCD stage 277 of the reference CCD pipeline 27 are supplied to buffers 41, 42, 43, . . . , and 47, respectively.

The output signals of the buffers 31, 32, 33, . . . , 37, i.e., the output signals of the CCD pipeline 1 are supplied to respective inputs of comparators 51, 52, 53, . . . , 57, respectively. On the other hand, the output signals of the buffers 41, 42, 43, . . . , and 47, i.e., the output signals of the reference CCD pipelines 21, 22, 23, . . . , 27 are supplied to respective inputs of the comparators 51, 52, 53, . . . , 57, respectively.

Therefore, for a signal voltage $V_{in}$, the comparator 51 compares the signal voltage $V_{in}$ with the first reference voltage $V_{R^1}$ at a first timing, the comparator 52 compares the signal voltage $V_{in}$ with the second reference voltage $V_{R^2}$ at a second timing, the comparator 53 compares the signal voltage $V_{in}$ with the third reference voltage $V_{R^3}$ at a third timing, the comparator 54 compares the signal voltage $V_{in}$ with the fourth reference voltage $V_{R^4}$ at a fourth timing, the comparator 55 compares the signal voltage $V_{in}$ with the fifth reference voltage $V_{R^5}$ at a fifth timing, the comparator 56 compares the signal voltage $V_{in}$ with the sixth reference voltage $V_{R^6}$ at a sixth timing, and the comparator 57 compares the signal voltage $V_{in}$ with the seventh reference voltage $V_{R^7}$ at a seventh timing.

That is, at the i-th timing, the i-th comparator compares a charge corresponding to the signal $V_{in}$ which has passed through the number i of CCD stages with a charge corresponding to the i-th reference voltage $V_{Ri}$ which has passed through the number i of CCD stages. Therefore, even when the characteristics of the charge input portions 10, 210, 220, 230, . . . , 270, the CCD stages 11, 12, 13, . . . , 17, 21, 221, 222, 231, 232, . . . , 271, 271, 273, . . . , and the output portions of the CCD stages are deteriorated, the characteristics are similar to each other. Therefore, comparison operations of the comparators 51, 52, 53, . . . , 57 are hardly affected by the characteristics of the CCD pipelines 1, 21, 22, 23, . . . , 27 and the like. In other words, even when the transfer efficiency of the CCD pipelines 1, 21, 22, 23, . . . , 27 is low, errors in A/D conversions can be reduced.

Further, the D/A converters of FIG. 3 which require a settling time are not provided in FIG. 4, thus enhancing the throughput.

The output signals of the comparators 51, 52, 53, . . . , 57 are supplied to a boundary detecting circuit 6, a delay circuit 7 and an encoder circuit 8, thus obtaining a 3-bit digital signal (D2, D1, D0).

An example of A/D conversion is explained next. Here, assume that $V_{R^1}$=0.5 V,
$V_{R^2}$=1.5 V,
$V_{R^3}$=2.5 V,
:
:
$V_{R^7}$=6.5 V Also, the signal voltage $V_{in}$ can be ranged from 0 V to 7 V, and in this case, is 4.2 V. Further, assume that the gain of the input/output transfer characteristics of each of the charge input portions 10, 210, 220, 230, . . . , 270 and the CCD stages of the CCD pipelines 1, 21, 22, 23, . . . , 27 is 1.

The comparator 51 compares the signal voltage $V_{in}$ (=4.2 V) with the reference voltage $V_{R^1}$(=0.5 V), so that the output signal CMP1 is high (="1"). The comparator 52 compares the signal voltage $V_{in}$ (=4.2 V) with the reference voltage $V_{R^2}$ (=1.5 V), so that the output signal CMP2 is high (="1"). The comparator 53 compares the signal voltage $V_{in}$ (=4.2 V) with the reference voltage $V_{R^3}$ (=2.5 V), so that the output signal CMP3 is high (="1"). The comparator 54 compares the signal voltage $V_{in}$ (=4.2 V) with the reference voltage $V_{R^4}$ (=3.5 V), so that the output signal CMP4 is high (="1"). The comparator 55 compares the signal voltage $V_{in}$ (=4.2 V) with the reference voltage $V_{R^5}$ (=4.5 V), so that the output signal CMP5 is low (="0"). The comparator 56 compares the signal voltage $V_{in}$ (=4.2 V) with the reference voltage $V_{R^6}$ (=5.5 V), so that the output signal CMP6 is low (="0"). The comparator 57 compares the signal voltage $V_{in}$ (=4.2 V) with the reference voltage $V_{R^7}$ (=6.5 V), so that the output signal CMP7 is low (="0"). Thus, the comparison result (CMP1, CMP2, CMP3, CMP4, CMP5, CMP6, CMP7) is (1, 1, 1, 1, 0, 0, 0), which is called a thermometer code.

The comparison result (CMP1, CMP2, CMP3, . . . , CMP7) is supplied to the boundary detecting circuit 6 which generates a boundary code signal (H1, H2, H3, . . . , H7). Each element of the boundary code signal (H1, H2, H3, . . . , H7) is synchronized by a delay circuit 7 and is supplied to an encoder circuit 8 which generates a 3-bit digital signal (D2, D1, D0)=(1, 0, 0).

Each portion of the A/D converter of FIG. 4 will be explained next.

Figure 5A:
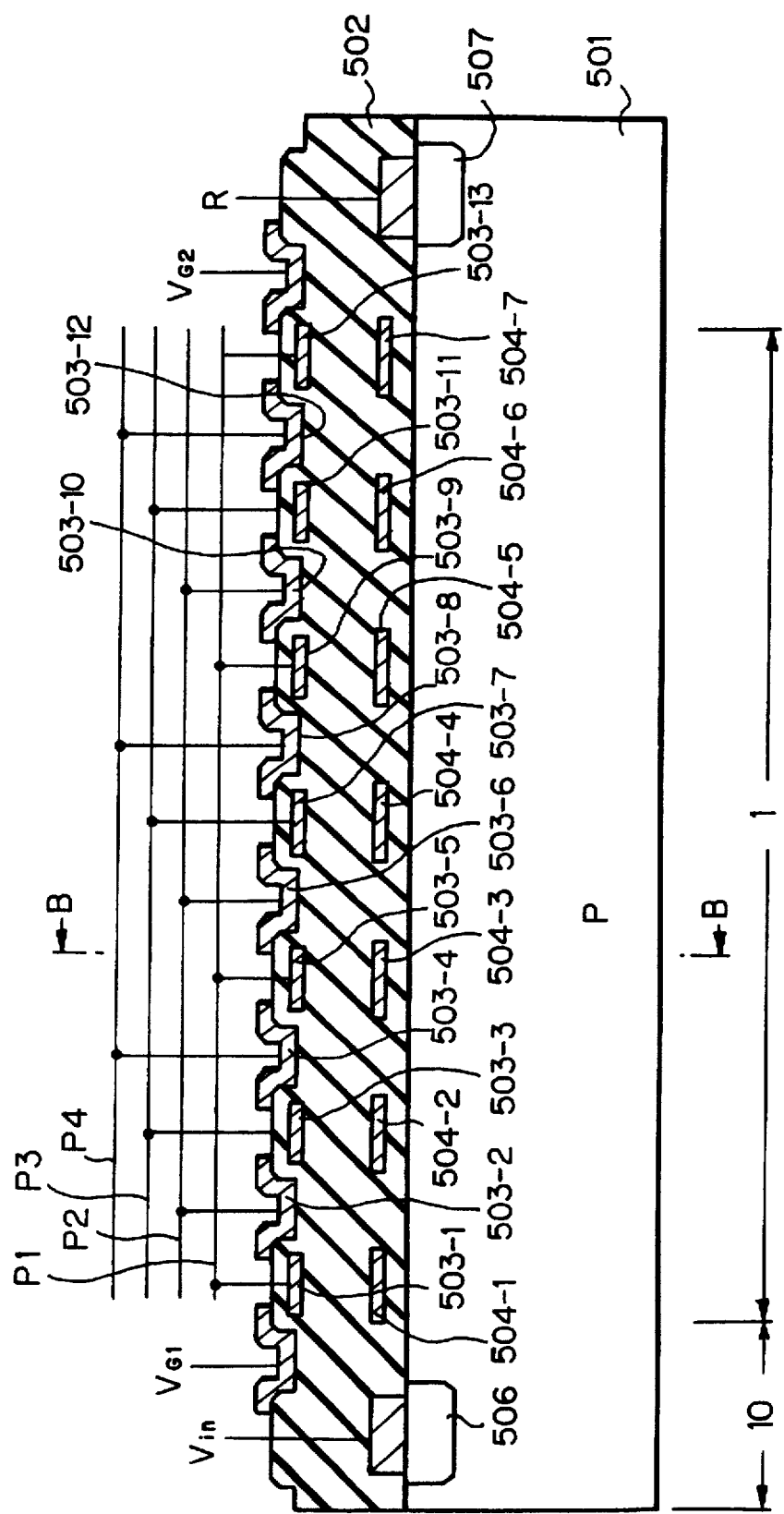
FIG. 5A is a longitudinal cross-sectional view of the charge input portion and the signal CCD pipeline of FIG. 4.
Figure 5B:
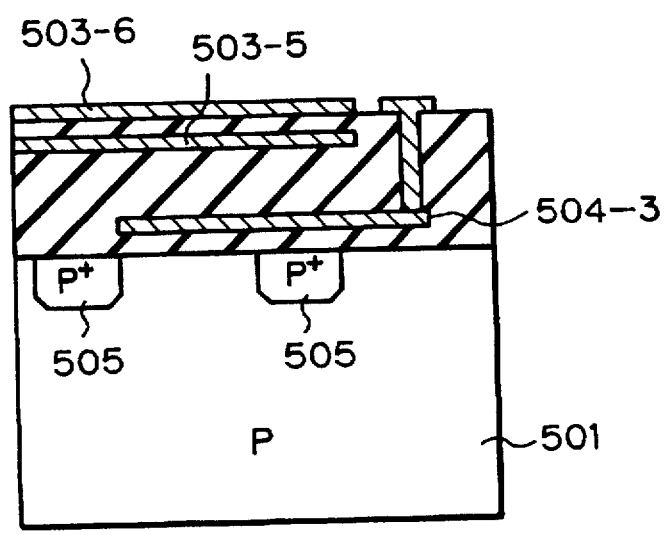
FIG. 5B is a traverse cross-sectional view taken along the line B—B of FIG. 5A.
Figure 6:
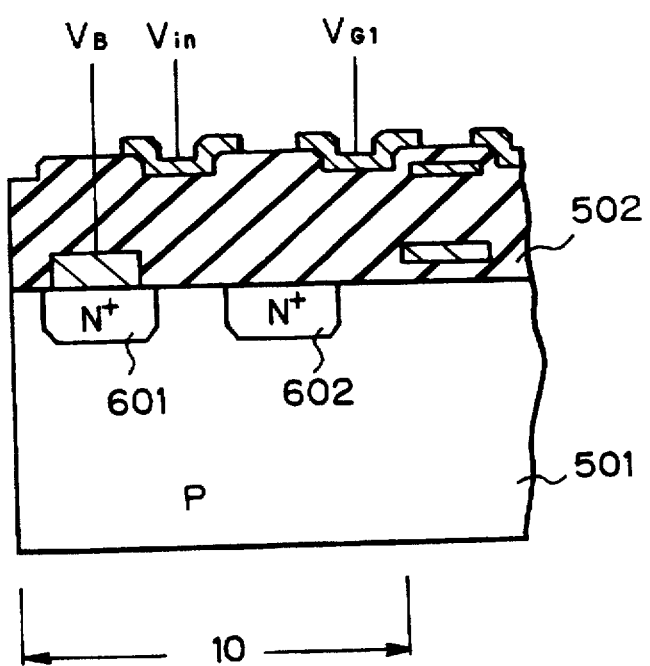
FIG. 6 is a cross-sectional view of a modification of the charge input portion of FIG. 5A.

FIG. 5A a longitudinal cross-sectional view of the charge input portion 10 and the signal CCD pipeline 1 of FIG. 4, and FIG. 5B is a traverse cross-sectional view taken along the line B—B in FIG. 4. In FIGS. 5 and 6, reference numeral 501 designates a P-type monocrystalline silicon substrate on which an insulating layer 502 made of silicon oxide is formed. Also, transfer electrodes 503-1, 503-2, . . . , 503-13 made of polycrystalline silicon are formed on the insulating layer 502 and within the insulating layer 502. The transfer electrodes 503-1, 503-5, 503-9 and 503-13 are clocked by a clock signal P1, the transfer electrodes 503-2, 503-6 and 503-10 are clocked by a clock signal P2, the transfer electrodes 503-3, 503-7 and 503-11 are clocked by a clock signal P3, the transfer electrodes 503-4, 503-8 and 503-12 are clocked by a clock signal P4. In this case, the clock signals P1, P2, P3 and P4 are shifted by 90 degrees from each other, so that the signal CCD pipeline 1 is four-phased.

Also, seven sensing electrodes 504-1, 504-2, . . . , 504-7 are provided within the insulating layer 502, and are connected via the buffers 31, 32, . . . , 37 to the comparators 51, 52, . . . , 57, respectively (FIG. 4). The sensing electrodes 504-1, 504-2, . . . , 504-7 sense charges therebeneath via parasitic capacitances between the sensing electrodes and the substrate 501.

Also, reference numeral 505 designates a channel stopper for defining a charge transfer portion within the substrate 501.

In FIG. 5A, reference numeral 506 designates an N-type impurity region forming a diode with the substrate 501. The signal voltage $V_{in}$ is applied to the N-type impurity region 506. Therefore, when a voltage $V_{G^1}$ is applied to form a potential well adjacent to the N type impurity region 506, a charge is transferred from the N-type impurity region 506 to the potential well, thus injecting the charge into the signal CCD pipeline 1.

Also, in FIG. 5A, reference numeral 507 designates an N-type impurity region forming a diode with the substrate 501. A reset voltage R is applied to the N-type impurity region 507. Therefore, when a voltage $V_{G^2}$ is applied to form a potential well adjacent to the N-type impurity region 507, a charge is transferred from the N-type impurity region 507 to the potential well, thus resetting the terminal of the signal CCD pipeline 1.

In the charge input portion 10 of FIG. 5A, the injected charge is not linear to the signal voltage $V_{in}$, and the injected charge is dependent upon the frequency of the voltage $V_{G^1}$. In order to improve this, the charge input portion 10 can be constructed as shown in FIG. 6. In FIG. 6, an N-type impurity region 601, to which a bias voltage $V_B$ is applied, and a floating N-type impurity region 602 are provided within the substrate 501. That is, when the signal voltage $V_{in}$ is applied between the N-type impurity regions 601 and 602, a charge in proportion to the difference in potential between the signal voltage $V_{in}$ and the bias voltage $V_B$ is transferred from the N-type impurity region 601 to the N-type impurity region 602.

The reference CCD pipelines 21, 22, 23, . . . , 27 have similar configurations to the signal CCD pepeline 1.

Figure 7:
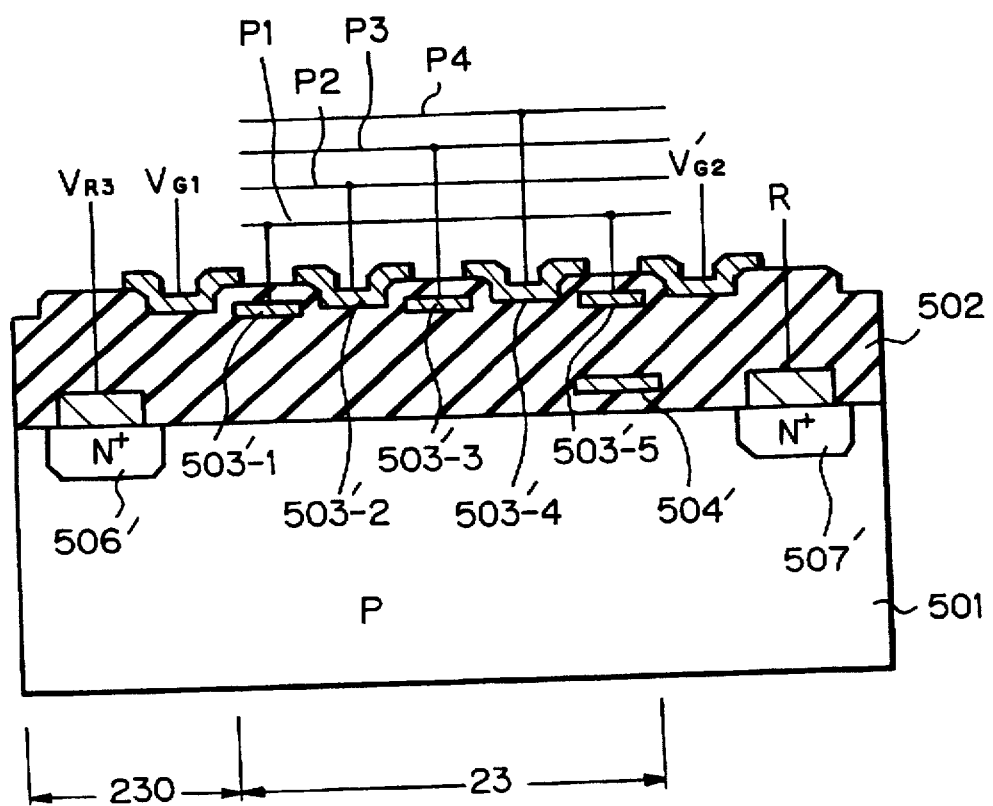
FIG. 7 is a longitudinal cross-sectional view of the charge input portion and the reference CCD pipeline of FIG. 4.

For example, the reference CCD pipeline 23 is illustrated in FIG. 7. In FIG. 7, only one sensing electrode 504' is provided, which is different from the signal CCD pipeline 1 as illustrated in FIG. 5A.

Figure 8:
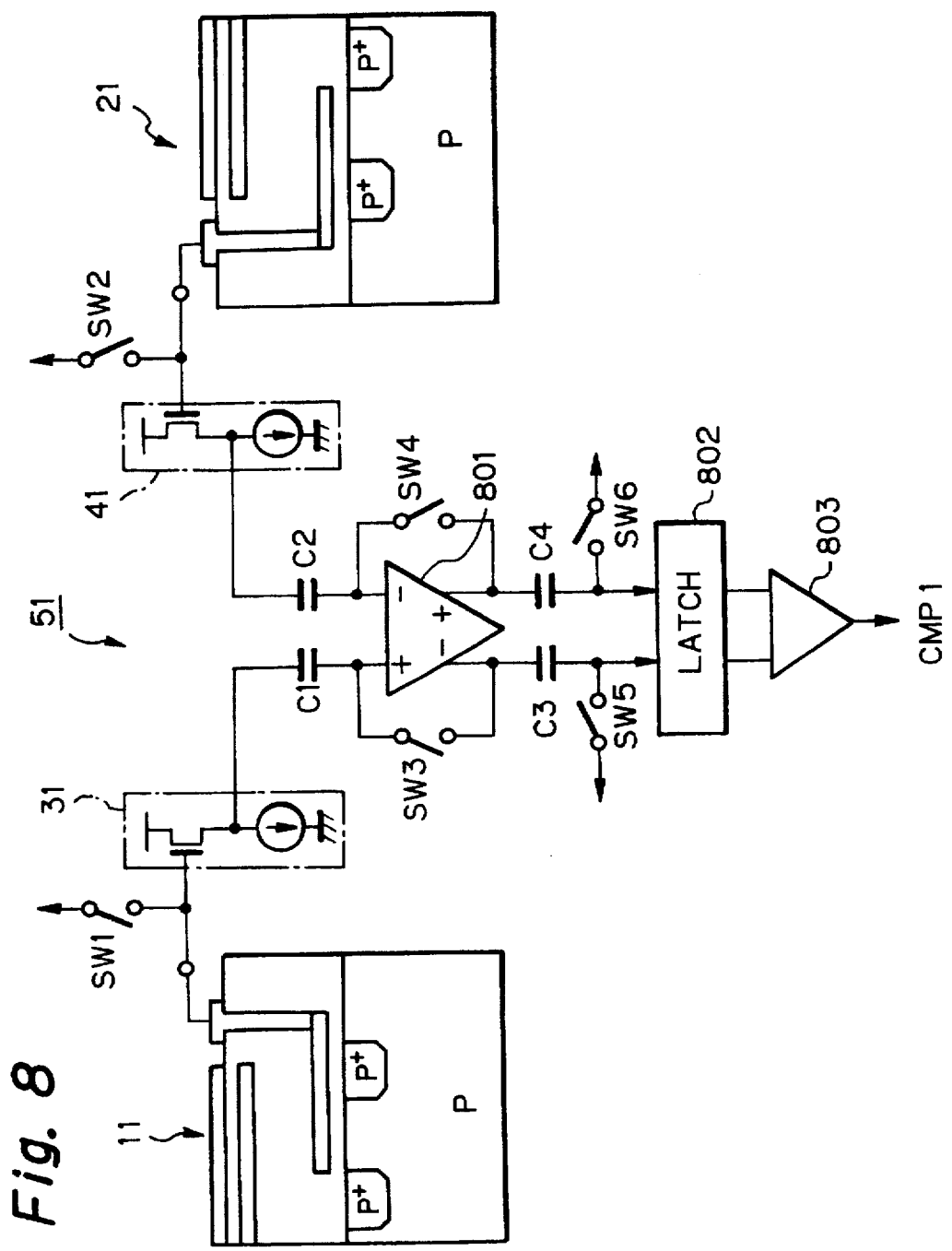
FIG. 8 is a circuit diagram of the comparator of FIG. 4.

In FIG. 8, which is a detailed circuit diagram of the comparator such as 51 of FIG. 4, the comparator 51 is composed of a differential amplifier 801 for amplifying the difference between the output signals of the buffers 31 and 41 which are formed by source followers, a latch circuit 802, and a comparator circuit 803 for generating a comparison output signal CMP1.

Switches SW1 and SW2 are turned ON to reset the sensing electrodes of the CCD stages 11 and 21, respectively. Also, the switches SW1 and SW2 are turned ON to charge offset voltages of the buffers 31 and 41 to capacitors C1 and C2, respectively, thus cancelling the offset voltages.

Switches SW3 and SW4 are turned ON to effect feedback upon the differential amplifier 801, so that offsets are charged to the capacitors C1, C2 and capacitor C3 and C4, thus cancelling the offsets.

Switches SW5 and SW6 are turned ON to reset the latch circuit 802.

During a reset period, all the switches SW1 to SW6 are turned ON, while, during a comparison period, all the switches SW1 to SW6 are turned OFF.

Figure 9:
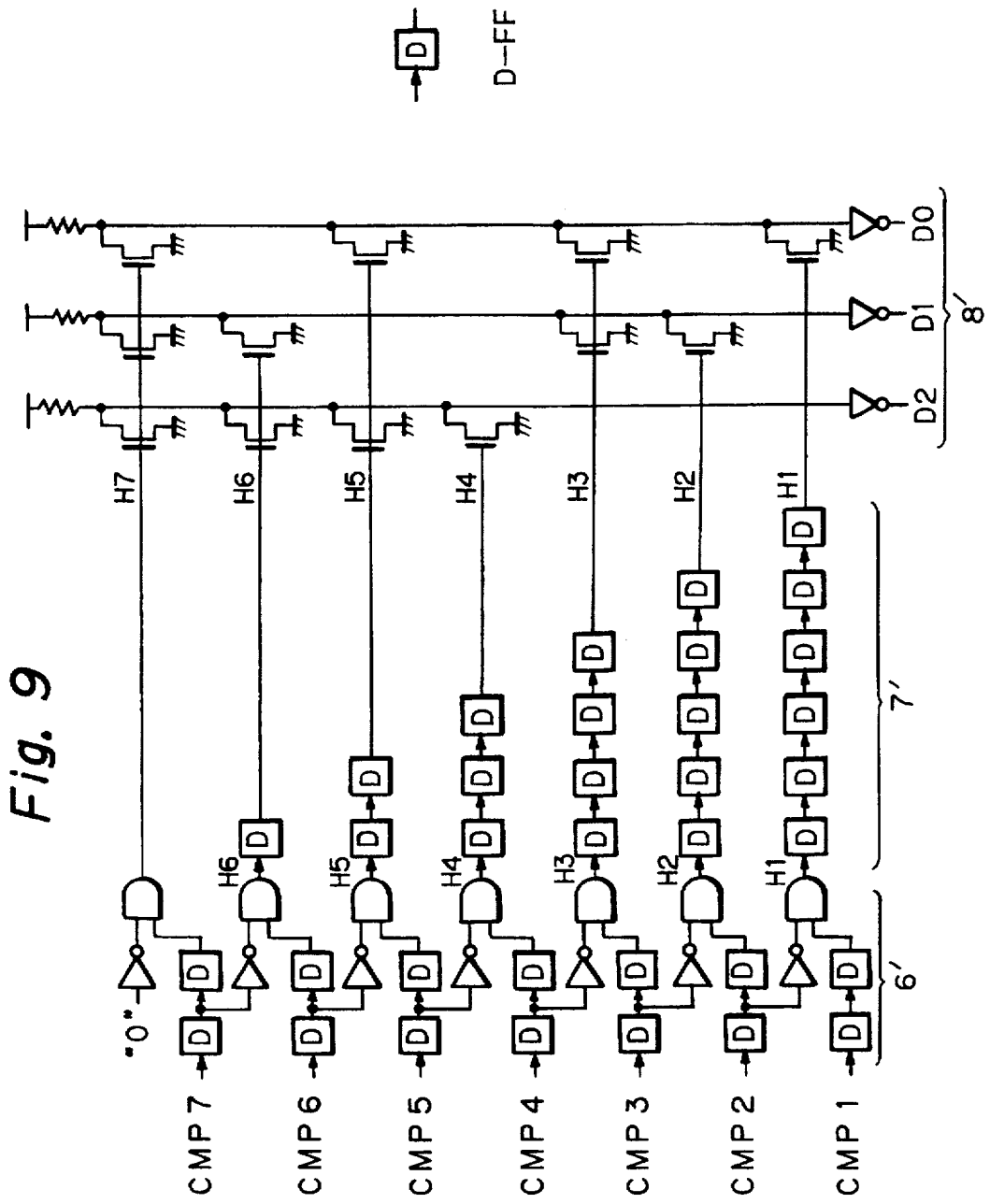
FIG. 9 is a circuit diagram of the boundary detecting circuit, the delay circuit and the encoder circuit of FIG. 4.

The boundary detecting circuit 6, the delay circuit 7 and the encoder circuit 8 are illustrated in FIG. 9.

The boundary detecting circuit 7 generates output signals H1, H2, . . . , H7 which have a relationship to the comparison output signals CMP1, CMP2, . . . , CMP7 as shown in FIG. 10. Also, the encoder circuit 8 generates a 3-bit digital signal (D2, D1, D0) which has a relationship to the output signals H1, H2, . . . , H7 as shown in FIG. 10.

Figure 11:
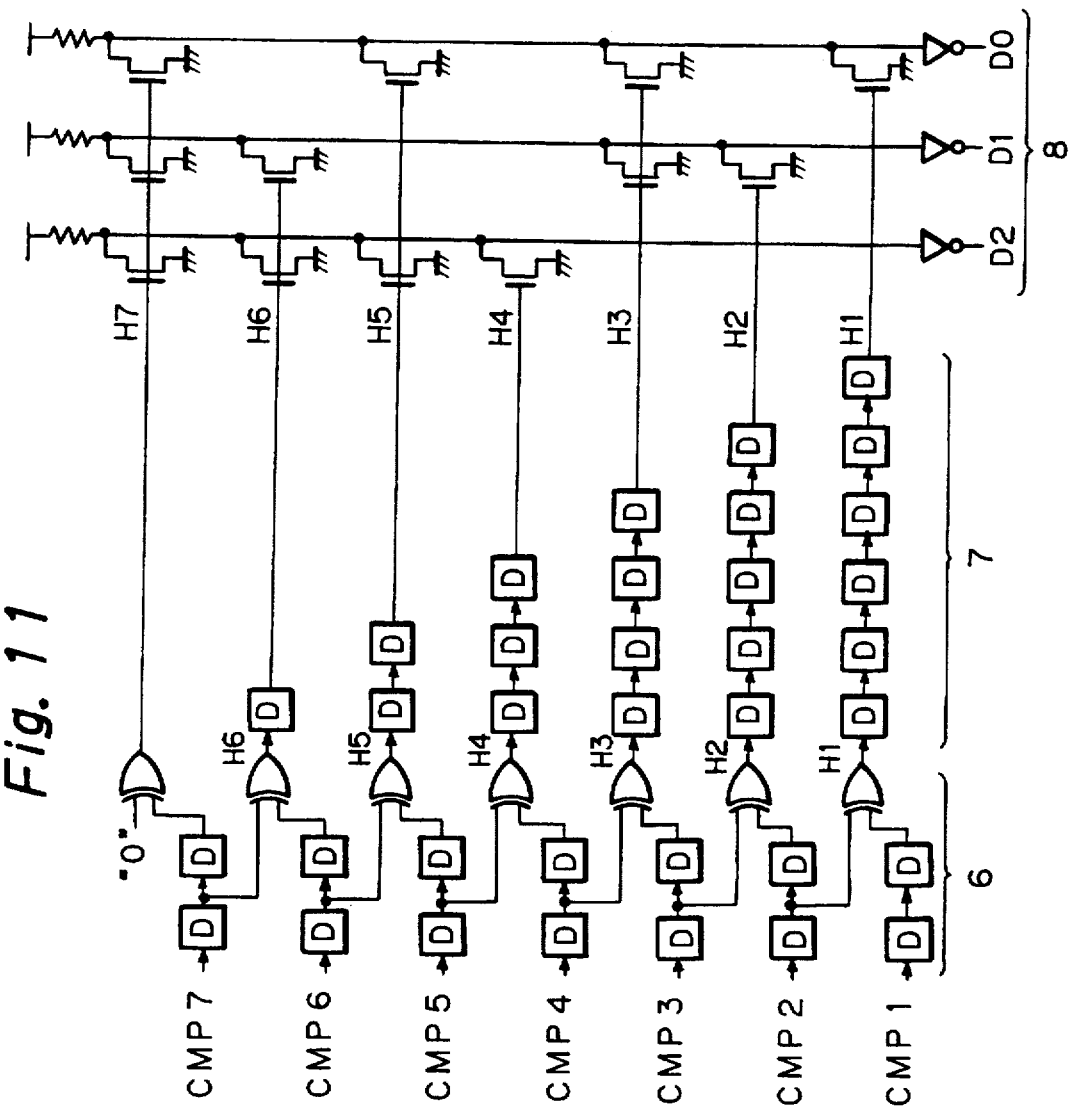
FIG. 11 and 12 are circuit diagrams illustrating modifications of the circuit of FIG. 9.

In FIG. 9, reference D designates a D-flipflop which determines a delay time T which is the same as a delay time of each CCD stage of the CCD pipelines 1, 21, 22, 23, . . . , 27. Also, the inverter and AND circuit of the boundary detecting circuit 6 of FIG. 9 can be replaced by an exclusive OR circuit as illustrated in FIG. 11.

Figure 12:
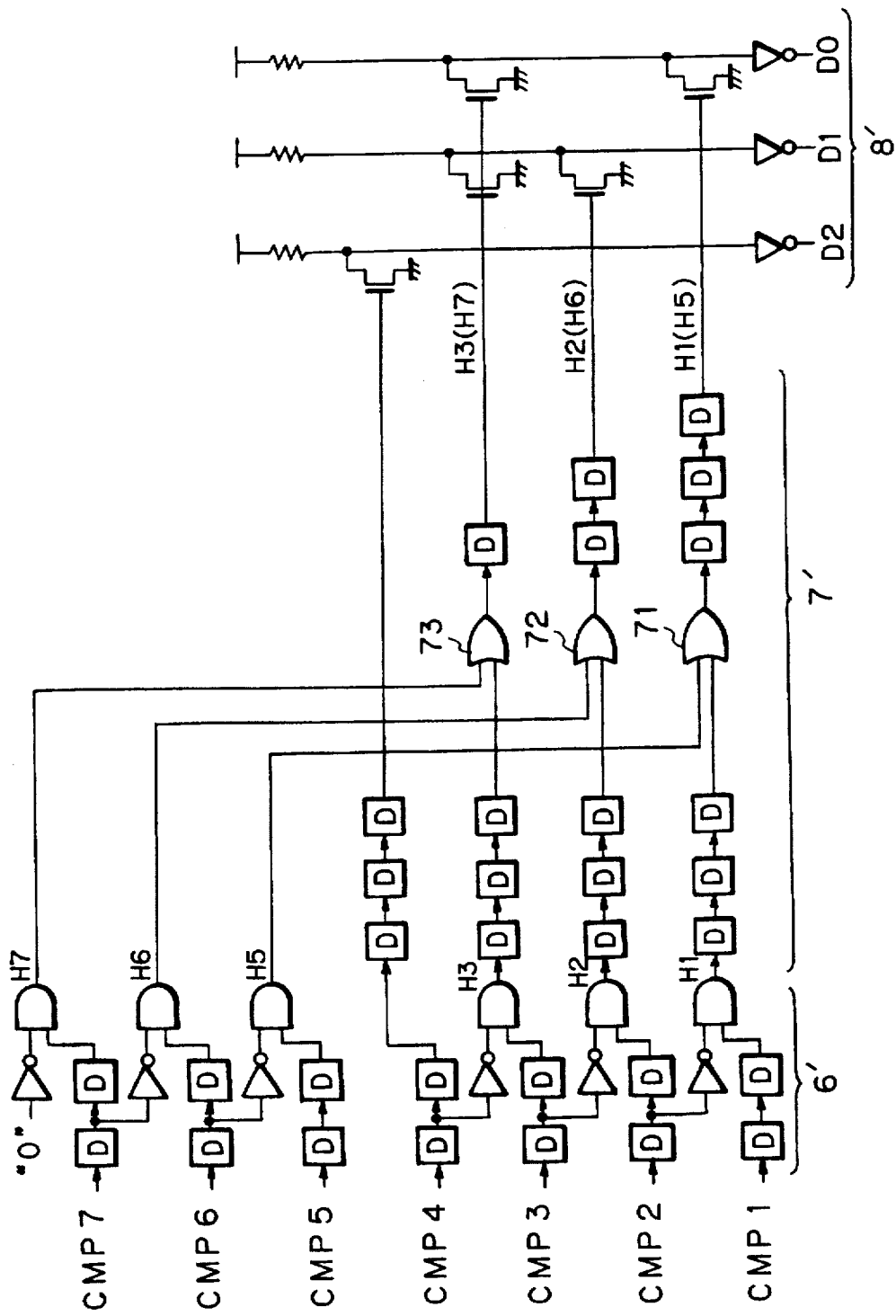

FIG. 12 is a modification of the boundary detecting circuit 6, the delay circuit 7 and the encoder circuit 8 of FIG. 9. That is, in a boundary detecting circuit 6' the signal H4 of FIG. 9 is not generated, and the output signal CMP4 of the comparator 54 is directly supplied via five D-flipflips to an encoder circuit 8', since, the logic of the output signal CMP4 is the same as the encoded data D2 as shown in FIG. 10.

Also, three OR circuits 71, 72 and 73 are introduced into a delay circuit 7', so that the output signals H1, H2 and H3 of the boundary detecting circuit 6' are combined with the output signals H5, H6 and H7 of the boundary detecting circuit 6'. That is, as shown in FIG. 10, the relationship between the signals H1, H2 and H3 and the encoded data D1 and D0 is the same as the relationship between the signals H5, H6 and H7 and the encoded data D1 and D0. In addition, when one of the signals H1, H2 and H3 is "1", all the signals H4, H5 and H6 are "0", and when one of the signals H4, H5 and H6 is "1", all the signals H1, H2 and H3 are "0".

Thus, in FIG. 12, the encoder circuit 8' can be reduced in size as compared with the encoder circuit 8 of FIG. 9.

Figure 13:
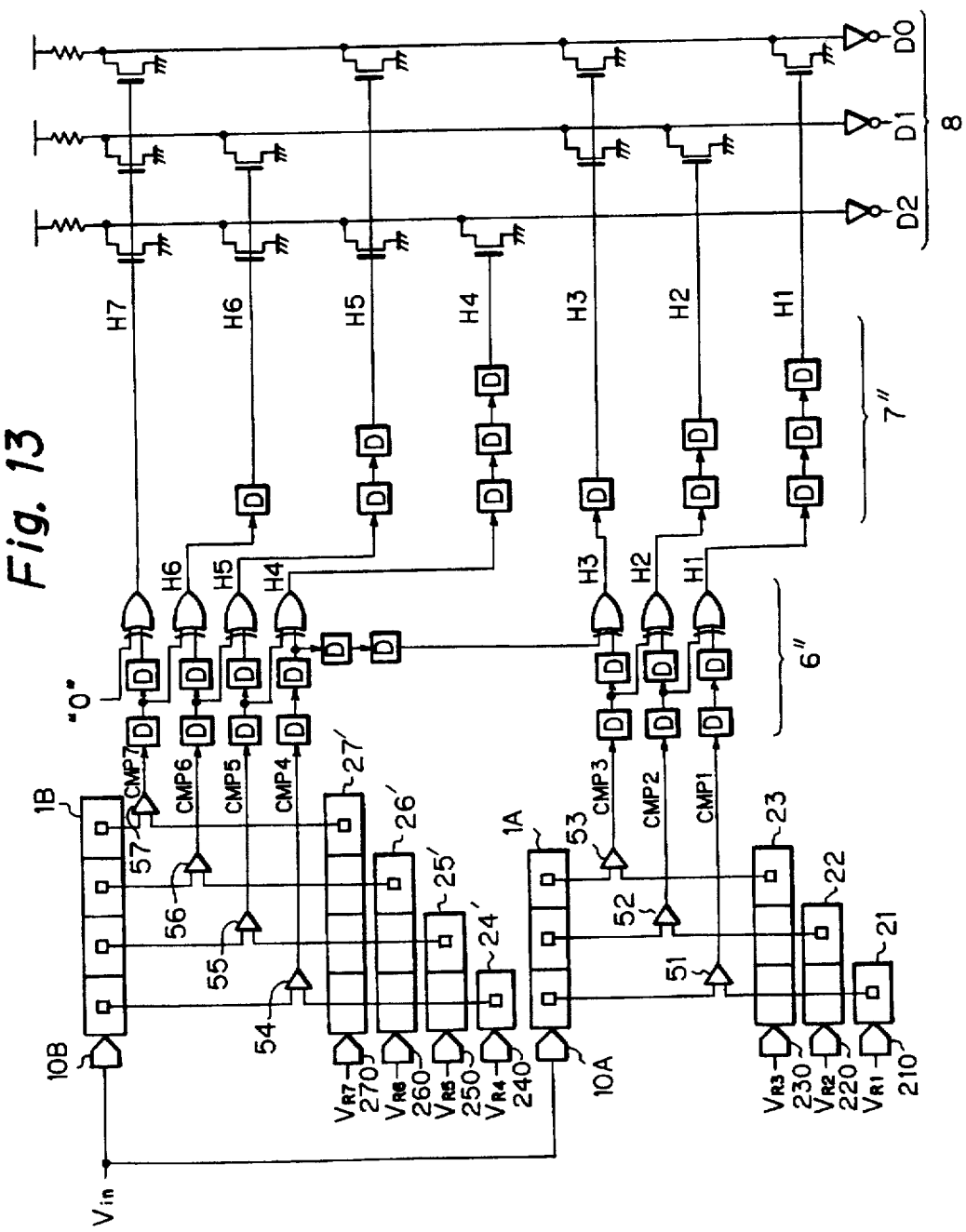
FIG. 13 is a circuit diagram illustrating a second embodiment of the A/D converter according to the present invention.

In FIG. 13, which illustrates a second embodiment of the present invention, the signal CCD pipeline 1 of FIG. 4 is divided into two signal CCD pipelines 1A and 1B. In this case, the signal CCD pipeline 1A is formed by three CCD stages, and the signal CCD pipeline 1B is formed by four CCD stages. Also, the reference CCD pipelines 24, 25, 26 and 27 are modified into reference CCD pipelines 24', 25', 26' and 27', respectively, whose CCD stage numbers are 1, 2, 3 and 4, respectively. A boundary detecting circuit 6" is similar to the boundary detecting circuit 6 of FIG. 11. Also, the delay circuit 7 of FIG. 9 is modified into a delay circuit 7" which is reduced in size as compared with the delay circuit 7 of FIG. 9.

The A/D converter of FIG. 13 operates in the same way as the A/D converter of FIG. 4. In this case, since the number of stages of the signal CCD pipelines which can operate in parallel is smaller than that in FIG. 4, the operation speed becomes larger.

Figure 14:
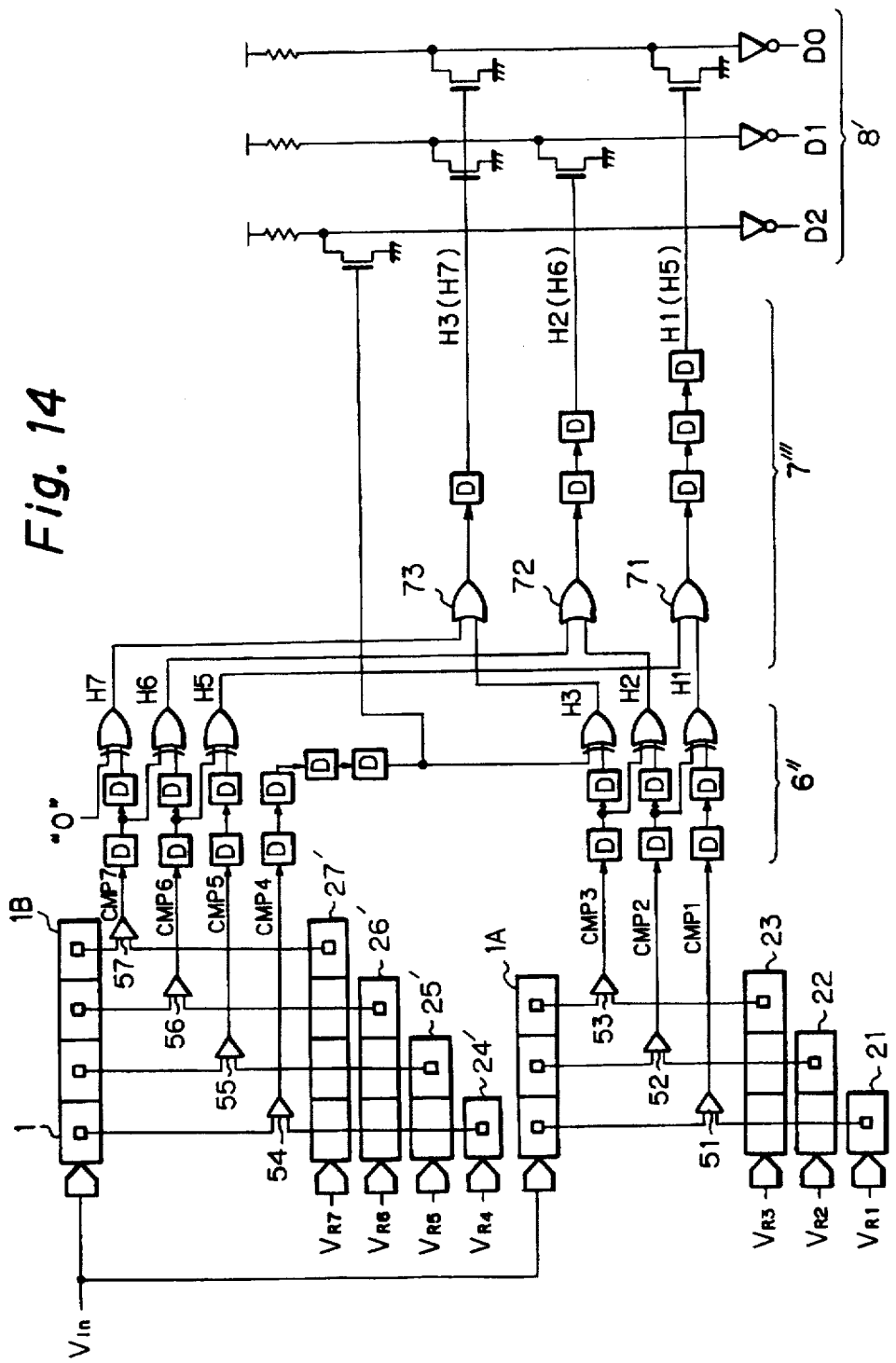
FIG. 14 is circuit diagram illustrating modifications of the circuit of FIG. 13.

In FIG. 14, which is a modification of the A/D converter of FIG. 13, the principle of FIG. 12 is applied to the A/D converter of FIG. 13. That is, in the boundary detecting circuit 6", the signal H4 of FIG. 13 is not generated, and the output signal CMP4 of the comparator 54 is directly supplied via four D-flipflips to the encoder circuit 8'.

Also, three OR circuits 71, 72 and 73 are introduced into a delay circuit 7'", so that the output signals H1, H2 and H3 of the boundary detecting circuit 6" are combined with the output signals H5, H6 and H7 of the boundary detecting circuit 6".

Thus, in FIG. 14, the encoder circuit 8' can be reduced in size as compared with the encoder circuit 8 of FIG. 13.

In FIGS. 13 and 14, two 2-bit A/D converters are connected in parallel to each other to form a 3-bit A/D converter. Therefore, the second embodiment can be applied to an (M+N) - bit A/D converter where $2^M$ N-bit A/D converters are connected in parallel to each other.

The above-described embodiments decribe a three-bit A/D converter; however, the present invention can be applied to an N-bit A/D converter where N is four or more. Also, in the above-described embodiments, each stage of the pipelines is one CCD element, however, each stage can be formed by two or more CCD elements.

As explained hereinabove, according to the present invention, since a settling time for D/A converters is unnecessary, the throughput can be enhanced. Also, since reference voltages are also generated from CCD pipelines, errors in A/D conversions can be reduced.

I claim:
1. An analog-to-digital converter comprising:
   a signal charge-coupled device (CCD) pipeline comprised of a plurality of stages for passing an analog signal therethrouqh;
   a plurality of reference CCD pipelines for passing reference signals therethrough;
   a plurality of comparator means, each connected to one of said stages of said signal CCD pipeline and to one of said reference CCD pipelines. for comparing output signals of said stages of said signal CCD pipeline with respective output signals of said reference CCD pipelines;

converting means. connected to said comparator means. for converting output signals of said comparator means into an encoded digital signal, wherein said converting means includes:

a boundary detecting circuit. connected to said comparator means, for detecting a transition between two adjacent output signals of said comparator means to generate detection signals;

a delay circuit, connected to said boundary detecting circuit, for delaying said detection signals in accordance with delay times of said reference CCD pipelines; and an encoder circuit. connected to said delay circuit. for outputting said encoded digital signals in accordance with said detection signals delayed by said delay circuit.

2. The A/D converter as set forth in claim 1, wherein said delay circuit comprises OR circuits for combining a first part of said detection signals with a second part of said detection signals, at least one of said output signals of said comparator means being supplied to said encoder circuit.

3. An analog-to-digital converter comprising:

a plurality of signal pipelines each comprised of a plurality of stages for passing an analog signal therethrough;

a plurality of groups of reference CCD pipelines for passing reference signals therethrough. each group corresponding to one of said signal CCD pipelines;

a plurality of comparator means. each connected to one of said stages of said signal CCD pipeline and to one of said reference CCD pipelines. for comparing output signals of said stages of said signal CCD pipelines with respective output signals of said reference CCD pipelines;

converting means, connected to said comparator means. for converting output signals of said comparator means into an encoded digital signal, wherein said converting means includes:

a boundary detecting circuit. connected to said comparator means, for detecting a transition between two adjacent output signals of said comparator means to generate detection signals;

a delay circuit, connected to said boundary detecting circuit, for delaying said detection signals in accordance with delay times of said reference CCD pipelines; and an encoder circuit, connected to said delay circuit, for outputting said encoded digital signals in accordance with said detection signals delayed by said delay circuit.

4. The A/D converter as set forth in claim 3, wherein delay circuit comprises OR circuits for combining a first part of said detection signals with a second part of said detection signals, at least one of said output signals of said comparator means being supplied to said encoder circuit.

5. An N-bit analog-to-digital converter comprising:

a signal CCD pipeline comprised of at least (N-1) stages for passing an analog signal therethrough;

at least (N-1) reference CCD pipelines for passing reference signals therethrough;

at least (N-1) comparator means, each connected to one of said stages of said signal CCD pipeline and to one of said reference CCD pipelines. for comparing output signals of said stages of said signal CCD pipeline with respective output signals of said reference CCD pipelines;

a boundary detecting means. connected to said comparator means, for detecting a transition between two adjacent output signals of said comparator means to generate detection signals;

a delay means, connected to said boundary detecting means. for delaying said detection signals in accordance delay times of said reference CCD pipelines; and an encoder means, connected to said delay means, for outputting an encoded digital signal in accordance with said detection signals delayed by said delay means.

6. The N-bit converter as set forth in claim 5, wherein said delay means comprises OR means for combining a first part of said detection signals with a second part of said detection signals, at least one of said output signals of said comparator means being supplied to said encoder means.

7. An (M+N) analog-to-digital converter comprising:

$2^M$ signal CCD pipelines each comprised of at least (N-1) stages for passing an analog signal therethrough;

$2^M$ groups of at least (N-1) reference CCD pipelines for passing reference signals therethrough. each group corresponding to one of said signal CCD pipelines;

a plurality of comparator means. each connected to one of said stages of said signal CCD pipelines and to one of said reference CCD pipelines. for comparing output signals of said stages of said signal CCD pipelines with respective output signals of said reference CCD pipelines;

a boundary detecting means, connected to said comparator means, for detecting a transition between two adjacent output signals of said comparator means to generate detection signals;

a delay means, connected to said boundary detecting means, for delaying said detection signals in accordance delay times of said reference CCD pipelines; and an encoder means, connected to said delay means, for outputting an encoded digital signal in accordance with said detection signals delayed by said delay circuit.

8. The A/D converter as set forth in claim 7, wherein said delay means comprises OR means for combining a first part of said detection signals with a second part of said detection signals, at least one of said output signals of said comparator means being supplied to said encoder means.

* * * * *